US007139893B2

(12) United States Patent
Hang

(10) Patent No.: US 7,139,893 B2
(45) Date of Patent: Nov. 21, 2006

(54) TRANSPARENT SDRAM IN AN EMBEDDED ENVIRONMENT

(75) Inventor: Chia-Lun Hang, Morgan Hill, CA (US)

(73) Assignee: Micron Technology, Inc., Boise, ID (US)

( * ) Notice: Subject to any disclaimer, the term of this patent is extended or adjusted under 35 U.S.C. 154(b) by 702 days.

(21) Appl. No.: 10/016,799

(22) Filed: Oct. 30, 2001

(65) Prior Publication Data

US 2003/0084234 A1 May 1, 2003

(51) Int. Cl.
*G06F 12/00* (2006.01)
(52) U.S. Cl. ................ 711/167; 711/168; 711/169; 711/170
(58) Field of Classification Search ........... 711/167, 711/168, 169, 170
See application file for complete search history.

(56) References Cited

U.S. PATENT DOCUMENTS 5,825,704 A    10/1998  Shau
5,901,101 A *  5/1999  Suzuki et al. ............... 365/222
6,046,953 A *  4/2000  Kiehl et al. ................. 365/222
6,260,127 B1   7/2001  Olarig et al.
6,373,769 B1 * 4/2002  Kiehl et al. ................. 365/222
2002/0078316 A1* 6/2002 Nakamura .................. 711/167

* cited by examiner

*Primary Examiner*—Reba I. Elmore
(74) *Attorney, Agent, or Firm*—Edward L. Pencoske; Jones Day

(57) ABSTRACT

A transparent memory array has a processor and a plurality of memory banks, each memory bank being directly connected to the processor. The memory array has improved throughput performance in part because it can function without precharge signals, row address latch signals, and column address latch signals, among others. The transparent memory array further comprises a plurality of row address decoders, each having a row address input bus and a row address output bus. One row address decoder's input bus is connected to the processor, while its output bus is connected to a first memory bank. The memory array is also comprised of a plurality of column address decoders, each having a column address input bus and a column address output bus. One column address decoder's input bus is connected the processor, while its output bus connected to the first memory bank.

46 Claims, 7 Drawing Sheets

TRANSPARENT SDRAM IN AN EMBEDDED ENVIRONMENT

FIELD OF THE INVENTION

The present invention relates generally to the field of integrated circuit devices and more particularly to integrated circuits having memory devices embedded directly therein.

BACKGROUND

The speed at which integrated circuit components function has increased rapidly in the past several years. For example, today's processors now function at speeds greater than one gigahertz, a vast improvement over processors available only a few years ago. Improvements are likely to increase processing speeds even further in the near future.

Memory component manufacturers, in an attempt to compliment the faster processors, have decreased memory device access times. Access time refers to the amount of time needed to complete a read or write operation within the memory device. By decreasing access time, the throughput of a memory device (i.e., the amount of data transferred within a given period) can be increased. For example, synchronous dynamic random access memory (SDRAM) was designed to overcome limitations inherent in previous memory devices. SDRAM utilizes an external clocking signal to match the timing of the memory operations with the operations of the other components of the integrated circuit, thereby decreasing device latency and improving throughput.

Initially, SDRAM was contained within a memory card. The memory card was comprised of several memory arrays, which contained one or more memory banks. Each memory bank was further comprised of a multitude of individual memory cells, arranged in rows and columns, which contained the information stored within the SDRAM.

During a write operation, a processor issued commands to an appropriate memory controller. The commands included address information and control signals (such as read or write signals, among others) The memory controller decoded the address signals to produce a row address strobe (RAS) signal and a column address strobe (CAS) signal, among others. A multiplexer, connected to the memory controller, routed the RAS signal and the CAS signal to the correct memory array (or memory bank within an array). The RAS signal was received by a row address decoder, which activated the appropriate row within a memory bank. Likewise, the CAS signal was received by a column address decoder, which activated a sense amplifier connected to the appropriate column within the memory bank. Thus, the RAS and CAS signals were used to select and to activate an individual memory cell (or cells) within the memory bank. After the selected memory cell was activated, data was transferred from a data bus to the cell.

During a read operation, the processor issued commands to the appropriate memory controller. As discussed above in conjunction with the write operation, a RAS signal and a CAS signal were produced to select and to activate the memory cell (or cells) within the memory bank. After the row and column address decoders activated the selected memory cell (or cells), data was transferred from the cell to the data bus.

In most applications, the memory card was placed within a memory slot; connected to, but external to, the integrated circuit. A multitude of traces connected the memory slot, and hence the memory card, to the integrated circuit. The memory card contained contact pins to connect the memory controllers to the traces. Due to space limitations, however, the memory card contained a finite number of contact pins. Thus, to overcome the space limitations, several arrays within the memory card (or memory banks within the arrays) were multiplexed to share a common controller. With this architecture, only a single array (or bank) within the group of memory arrays (or banks) could be accessed at a given time by the shared controller.

Connecting the arrays (or banks) with a multiplexer necessitated the use of additional control signals, such as precharge and latch signals among others. A precharge signal was used to raise the voltage level of a bank's row (or column) before the row (or column) was accessed by a write or read operation. The precharge ensures that a state change will occur during the write or read operation which can be sensed by the memory array's sense amplifier. Application of a precharge signal decreased the memory device's throughput because another row (or column) could not be accessed until the precharge level was reached.

A latch signal "locks" the signal being sent to the memory bank, such as RAS and CAS signals for example, for a specified period of time. One purpose of the latch signal was to stabilize the memory bank while data was written to or retrieved from the memory cell. Again, throughput was decreased because a specific amount of time, usually governed by the physical characteristics of the memory bank, had to pass before a different signal (such as a command signal, address signal, data signal, etc.) could be applied or sensed.

The delays caused by the precharge and latch signals, among others, is called latency. For example, if a RAS signal is applied to select a specific row within a memory bank, the amount of time that must pass before another signal can be applied, such as a CAS signal, is called the RAS latency. Likewise, if a CAS signal is applied to select a specific column within a memory bank, the amount of time that must pass before another signal can be applied is called the CAS latency. The greater the latency, the smaller the throughput.

In addition to the inherent space limitations, externally mounted SDRAM suffered from propagation delays. Propagation delay refers to the additional amount of time required by a signal to travel through a trace, or electrical conductor, caused by the resistance, or impedance, of the trace. As a general rule, a signal traveling through a longer trace will have a greater propagational delay than a signal traveling through a shorter trace made from the same material. The traces between external memory cards and the integrated circuits are relatively long compared to other traces within the integrated circuit. Therefore, signals traveling between the external memory cards and the integrated circuit have greater propagational delays than other signals within the integrated circuit.

Manufactures have attempted to overcome some of the problems associated with externally mounted SDRAM by embedding the SDRAM directly within the integrated circuit. Such embedded technology is also referred to as a system in package ("SIP") environment. For example, current embedded SDRAM has proven to be faster than external SDRAM because shorter traces can be used, thereby reducing the propagational delay. However, current embedded SDRAM technology continues to utilize multiplexed memory arrays (or banks). Thus, the current embedded SDRAM continues to suffer from throughput limitations inherent in multiplexed memory arrays (and banks).

Therefore, there exists a need for a device and a method that overcomes the throughput limitations inherent in external SDRAM. Furthermore, there exists a need to overcome the throughput limitations inherent in current embedded SDRAM.

SUMMARY

One embodiment of the present invention relates to a combination comprising a processor and a transparent memory array. The memory array has a plurality of memory banks, each of which is directly connected to the processor. The memory array is operable to function without at least one of a precharge signal, a row address latch signal, and a column address latch signal.

Another embodiment of the present invention relates to a combination comprising a processor and a plurality of transparent memory arrays which are directly connected to the processor. Each of the memory arrays is operable to function without at least one of a precharge signal, a row address latch signal, and a column address latch signal.

Additionally, another embodiment of the present invention relates to a combination comprising an integrated circuit having a processor and an embedded memory array. The memory array has a plurality of controllers and a plurality of memory banks. Each of the memory banks is independently connected to one of the plurality of controllers; each of the controllers is independently connected to the processor.

Yet another embodiment of the present invention relates to a combination comprising an integrated circuit having a processor and an embedded memory array. The memory array has a plurality of memory banks; each of said which is independently connected to the processor.

An embodiment of the present invention relates to a combination comprising a processor and a plurality of transparent SDRAM arrays directly connected to the processor.

Another embodiment of the present invention relates to a combination comprising a processor and a transparent SDRAM having a plurality of memory banks, each of the memory banks being directly connected to the processor.

Yet another embodiment of the present invention relates to a combination comprised of a processor and a transparent SDRAM having a plurality of memory banks connected to the processor such that said processor may simultaneously access more than one of the memory banks.

An embodiment of the present invention relates to a transparent memory array comprised of a plurality of memory banks and a plurality of peripheral devices for writing information into and reading information out of memory cells contained within the memory banks. The peripheral devices include controllers, on of each controller is connected to one of each memory banks, and the plurality controllers are operable to simultaneously communicate with a processor.

Another embodiment of the present invention relates to a method for decreasing the access latency of an integrated circuit having a processor and a plurality of embedded memory arrays. The plurality of memory arrays have a plurality of memory banks. The method comprises connecting each of the plurality of memory banks to the processor and simultaneously accessing at least two of the embedded memory banks with the processor.

Finally, another embodiment of the present invention relates to a method for increasing the throughput of an integrated circuit having a processor and a transparent SDRAM array. The transparent SDRAM array has a controller, a data bus, and a plurality of memory banks, each of said plurality of memory banks is independently connected to the controller. The method comprises at least one of: simultaneously reading data from more than one of the plurality of memory banks; and, simultaneously writing data from more than one of the plurality of memory banks.

Advantages of the present invention include the elimination of precharge and latch cycles, improved latency, and increased device throughput. Memory arrays and memory banks are connected to the processor without using multiplexers, therefore, requests made to different memory arrays/banks are simultaneously processed. Each array/bank can have a different burst mode to meet a variety of protocols in a network. These advantages may be implemented with little change in the SDRAM block. These, and other advantages and benefits, will become apparent from the Detailed Description hereinbelow.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

Figure 1:
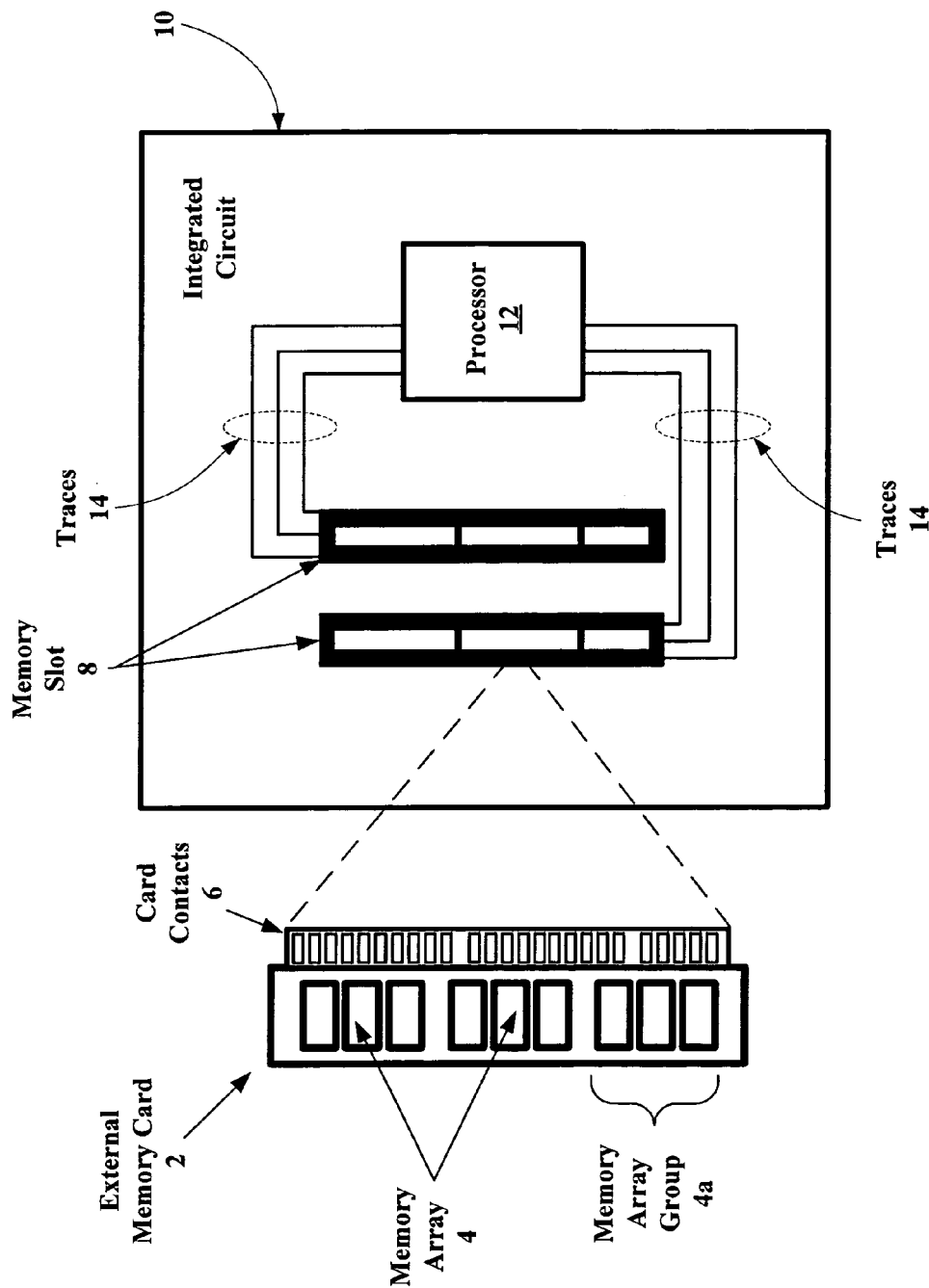
FIG. 1 illustrates an integrated circuit utilizing an external memory device as is common in the prior art.

FIG. 1 illustrates a simplified diagram of an integrated circuit 10 utilizing an external memory card 2 as is common in the prior art. The integrated circuit 10 contains a processor 12 and memory slots 8. The processor 12 is connected to the memory slots 8 by memory slot traces 14.

An external memory card 2 comprised of groups 4a of SDRAM memory arrays 4 and card contacts 6 is also shown in FIG. 1. The memory arrays 4 are comprised of a multitude of memory banks (not shown) containing individual memory cells (not shown). Due to a finite number of card contacts 6, among others, the memory arrays 4 are grouped together. Each memory array 4 within a group (e.g., 4a) is connected to a multiplexer (not shown). The multiplexers are connected to a controller (not shown), which is connected to one or more card contacts 6. Alternatively, the memory arrays within group 4a may be connected to a multiplexer within the controller. The memory card 2 is then placed within the a memory slot 8, where the card contacts 6 are electrically connected to corresponding slot traces 14. The slot traces 14 are routed within the integrated circuit 10 to the processor 12. Each memory array group (e.g., 4a) has a corresponding slot trace 14. The processor 12 is capable of accessing (i.e., receiving and storing) data within the memory arrays 4 via the slot traces 14.

In an alternative architecture, each memory array 4 contains a multiplexer which is directly connected to the processor through slot traces 14. However, the memory banks within the memory array 4 are connected to the multiplexer and not directly to the processor. In either architecture, the processor cannot access the individual memory cells without encountering a multiplexer.

The multiplexers restrict communication between the processor 12 and the individual memory cells. For example, the processor 12 cannot communicate with another memory array 4 within the group (e.g., 4*a*), or a bank within an array 4, until the memory array 4 or bank being accessed completes its assigned operations.

It should be noted that other components such as amplifier circuits, power circuits, and other peripheral circuits, among others, may also be included on memory card 2 or within each memory array 4. Furthermore, the memory card 2 may employ various types of memory arrays 4, such as SDRAM and static random access memory (SRAM), among others.

It should further be noted that integrated circuit 10 may contain other components such as controllers, buffer chips, timer chips, capacitors, resistors, contact pads and additional traces. In addition, the integrated circuit 10 may be connected to other components, for example, a disk drive, a video monitor, speakers and a keyboard within a computer system.

A major benefit of using an external memory card 2 is flexibility. For example, additional memory cards 2 can be added to free memory slots 8 to increase the amount of memory capacity of the integrated circuit 10. Also, older memory cards 2 can easily be replaced with faster memory cards 2 simply by swapping the components. However, as previously discussed, space constraints on the memory card 2 limit the number of card contacts 6, thereby requiring the memory arrays 4 or memory banks to be grouped and multiplexed. The multiplexed arrays 4 or banks are generally slower due to latency induced by the multiplexers. Furthermore, the long slot traces 14 cause higher propagational delays (as will be discussed later) for external memory cards 2.

Figure 2:
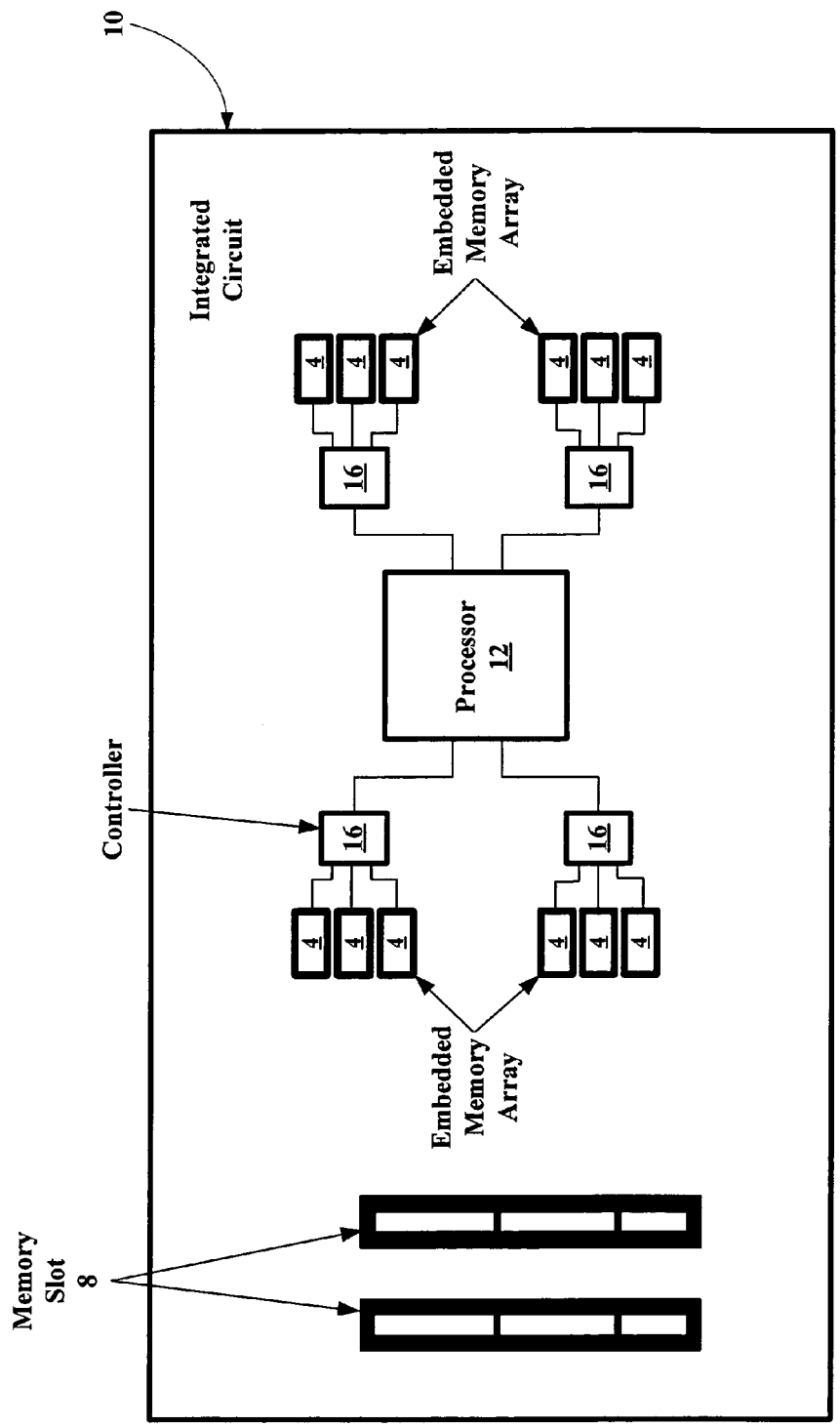
FIG. 2 illustrates an integrated circuit utilizing embedded SDRAM as is common in the prior art.

FIG. 2 illustrates the integrated circuit 10 as discussed in FIG. 1 utilizing embedded SDRAM memory arrays 4 as is common in the prior art. The integrated circuit 10 retains the memory slots 8 so that additional external memory capacity may be added as needed. The embedded SDRAM memory arrays 4 are again illustrated in groups of three. Each memory array 4 within a group is connected to a multiplexer within controller 16. The controller 16 is also connected to the processor 12, which is capable of accessing (i.e., receiving and storing) data within the memory arrays 4 via the controller 16.

In an alternative architecture, each memory array 4 has its own controller which is directly connected to the processor 12. The memory banks within the memory array 4, however, are connected to a multiplexer within a controller due to the limited space. In either architecture, the processor cannot access the individual memory cells without encountering a multiplexer.

By embedding the SDRAM memory arrays 4 within the integrated circuit 10, shorter traces are created between the memory arrays 4 and the processor 12. Thus, the amount of propagation delay, among others, is reduced and the throughput of the memory arrays 4 increased. However, to simplify the control functions of the processor, among others, the embedded memory arrays 4 of the prior art retained the grouping and multiplexing scheme. Thus, the throughput of the integrated circuit 10 is reduced because the processor 12 can only access one memory array 4 at a time within each multiplexed group.

Figure 3:
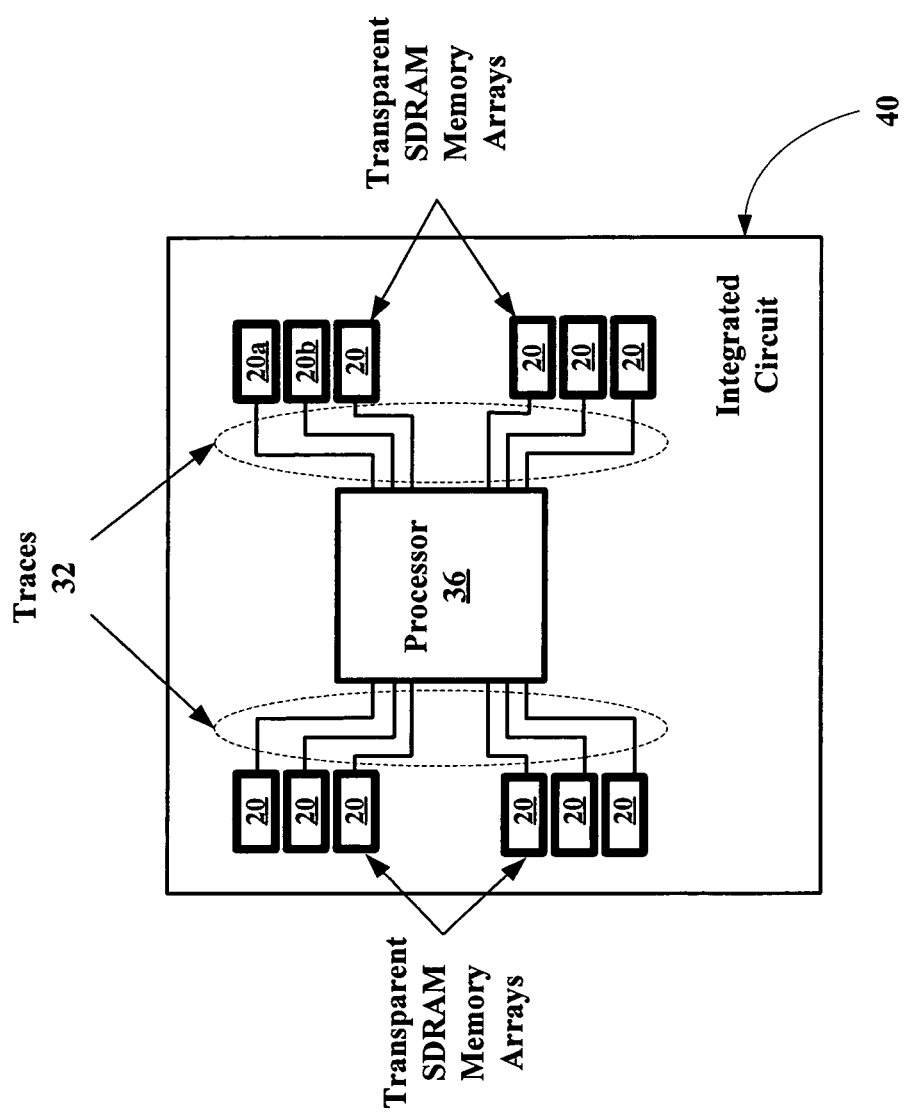
FIG. 3 illustrates the integrated circuit utilizing transparent SDRAM memory arrays according to an embodiment of the present invention.

FIG. 3 illustrates the integrated circuit 40 utilizing transparent SDRAM memory arrays 20 according to an embodiment of the present invention. In the current embodiment, each memory array 20 and each memory bank (not shown) within the memory array is directly connected to the processor 36. In such a configuration, the traces 32 connecting a memory array 20 and the processor 36 can be shortened to reduce propagation delay. Additionally, the processor 36 is capable of accessing all of the memory arrays 20 or memory banks simultaneously. For example, processor 36 accesses a row and a column within memory array 20*a*, while at the same time accessing a row and column within memory array 20*b*. Because each memory array 20*a*, 20*b* is independently connected to processor 36, the signals do not need to be multiplexed.

In the current embodiment, each memory bank within memory array 20 contains a controller for processing command signals, and each memory bank has a row address and column address decoder for simultaneously processing the address signals. In the current embodiment, the processor can access each individual memory cell without first encountering a multiplexer.

Traces 32 are comprised of a multitude of conductors which are capable of carrying address information, control signals, and data, among others. In the current embodiment, processor 36 also contains an arbitration unit which is capable of processing address commands for a multitude of memory arrays 20 in a parallel fashion. For example, a first request for bank 'a' will be processed at the same time as a second request for bank 'b' is processed, if both bank 'a' and bank 'b' are available. The arbitration unit is also able to serially process address commands for a single memory array 20. For example, if the first and second requests are both directed to bank 'a', the second request is processed after the first request is completed.

The SDRAM memory arrays 20 are referred to as "transparent" because, to a programmer or system designer, among others, the transparent SDRAM memory arrays 20 appear to function in the same manner as the prior art embedded SDRAM. For example, a programmer would use the same address information to access an embedded SDRAM as to access a transparent SDRAM. The address information, however, is treated differently by the transparent SDRAM.

In the current embodiment, processor 36 contains sufficient contacts for each memory array 20 such that processor 36 can simultaneously access and control each memory array 20 within the integrated circuit 40. Because each memory array 20 is individually connected to the processor 36, precharge, row latch, and column latch signals, as well as multiplexer delays, are avoided. As previously discussed, precharge, row latch, and column latch signals, as well as multiplexer delays, decrease memory device throughput.

Figure 4:
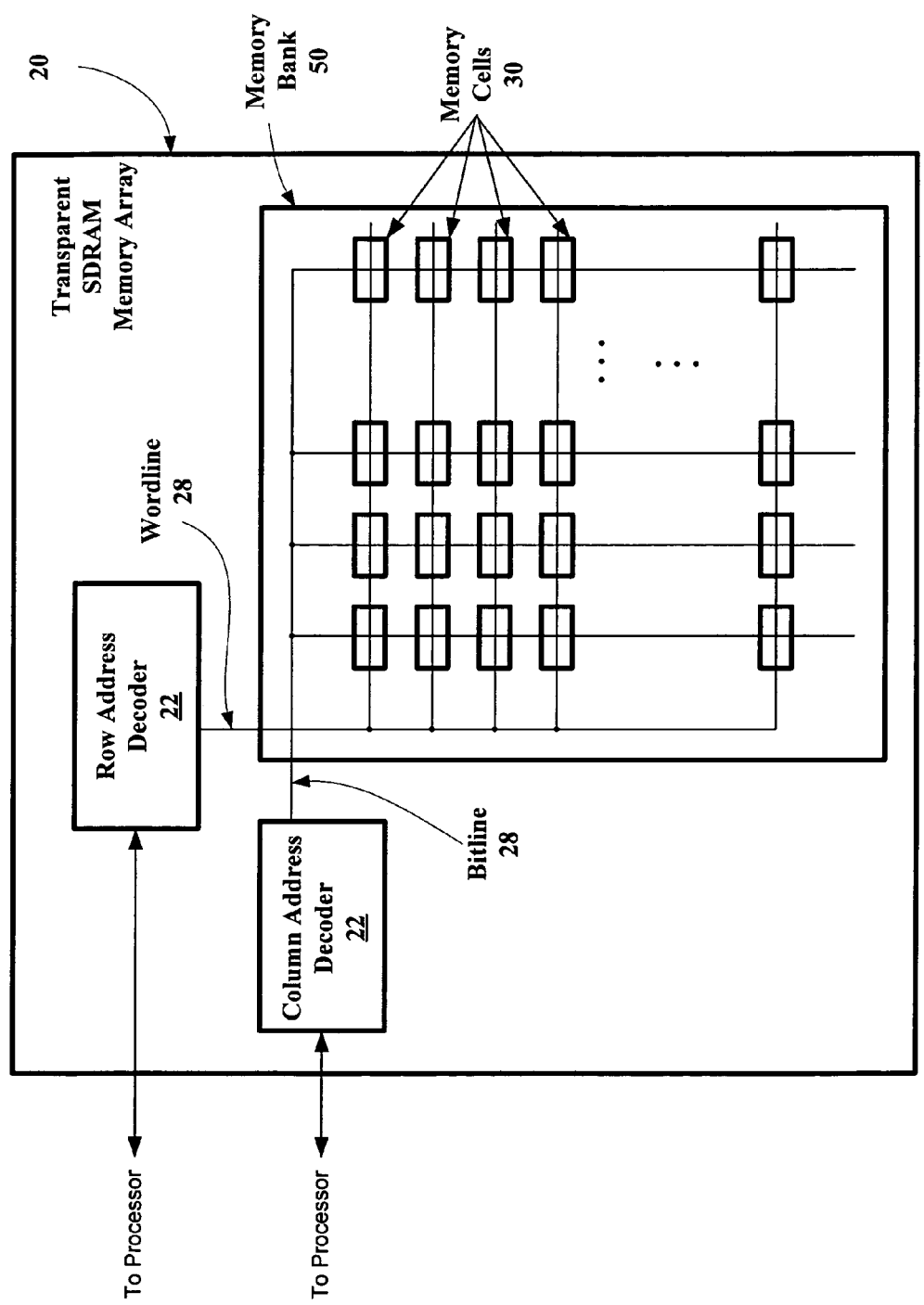
FIG. 4 illustrates a transparent memory array according to an embodiment of the present invention.

FIG. 4 illustrates a transparent SDRAM memory array 20 according to an embodiment of the present invention. In the current embodiment, memory array 20 is comprised of, among others, a multitude of individual memory cells 30, a row address decoder 22, and a column address decoder 24. In the current embodiment of the present invention, each memory array 20 is individually connected to a processor, thereby eliminating the requirement that a multiplexer be placed between the processor and a group of memory arrays 20. In an alternative embodiment, the row address decoder 22 and the column address decoder 24 are connected to a controller. The controller is connected to the processor without the use of a multiplexer.

In the current embodiment, the individual memory cells 30 are contained in a memory bank 50. The memory cells 30, arranged in rows and columns, contain the bits of data stored within the memory array 20. Data is transferred from a cell 30 to a data output bus (not shown) during a read operation. On the other hand, data is transferred from the data bus to the cell 30 during a write operation.

During the read and write operations, the desired memory cell 30 must be accessed. The row address decoder 22 accepts control and address signals directly from a processor (not shown) or memory controller (not shown) over a row address input bus. 'Directly' refers to a signal that is exchanged between the processor and a specific memory array without needing a multiplexer. The row address decoder 22 decodes the signals and activates its word line 26 (i.e., row address output bus), thereby selecting one or more desired rows of memory cells 30. Each memory cell 30 within an activated row outputs its data to its corresponding bit line.

Likewise, the column decoder 24 accepts control and address signals directly from the processor or memory controller over a column address input bus. The column address decoder 24 decodes the signal and activates the sense amp for the desired bit line 28 (i.e., column address output line), thereby selecting one or more desired columns of memory cells 30. Data is transferred to or from a memory cell 30 within the active row and active column, to or from a data bus (not shown).

In the current embodiment, precharge and latch signals are not required because each memory array 20 is individually connected to the processor. Prior art SDRAM share, via time multiplexing among others, a common RAS and CAS address to reduce the number of input and output contacts (i.e., the pin count). For example, a RAS signal is sent to the memory bank via a contact during a read operation. The signal RAS signal is latched for a predetermined time while the appropriate memory cells are accessed. After the predetermined time, the latch signal is removed and a precharge signal is placed on the contact. Next, a CAS signal is sent to the memory bank via the same contact. Again, the CAS signal is latched for a predetermined time while the appropriate memory cells are accessed. Because the address is shared, a latch and precharge signal must be used for proper operation.

In contrast, transparent SDRAM takes advantage of embedded technology, in which I/O pins do not exist between the memory arrays 50 and the processor, or in System in Package ("SIP") architecture which accommodates a sufficient number of pins such that the RAS and CAS address are not shared. Thus, the transparent SDRAM does not require the latch and precharge cycles for operation. A row address signal and a column address signal are sent simultaneously, via separate traces, such that the latency caused by a latch signal, a precharge signal, and multiplexing is eliminated.

Each transparent memory array 20 is capable of having a different signal burst mode, such as fixed-length burst mode and full-page burst mode, among others. Because signals such as precharge signals and latch signals do not affect the row address latency periods, the row address signal in the current embodiment has a row address latency period which is dependent primarily on the row address decoding pipeline. The row address decoding pipeline refers to the row address input, the row address decoder, and the row address output.

Likewise, the column address signal has a column address latency period which is dependent primarily on the column address decoding pipeline. Column address decoding pipeline refers to the column address input, the column address decoder, and the column address output. Thus, signals such as precharge signals and latch signals do not affect the column address latency periods.

It should be noted that other components such as controllers, power circuits, and other peripheral circuits, among others, may also be included within memory array 20, but are not shown as they do not form a feature of the present invention. Furthermore, in an alternative embodiment, the memory array 20 may be a type other than SDRAM, such as static random access memory (SRAM), for example. In yet an another embodiment, the row address decoders 22 and column address decoders 24, among others, may be contained within the memory bank 50.

Figure 5:
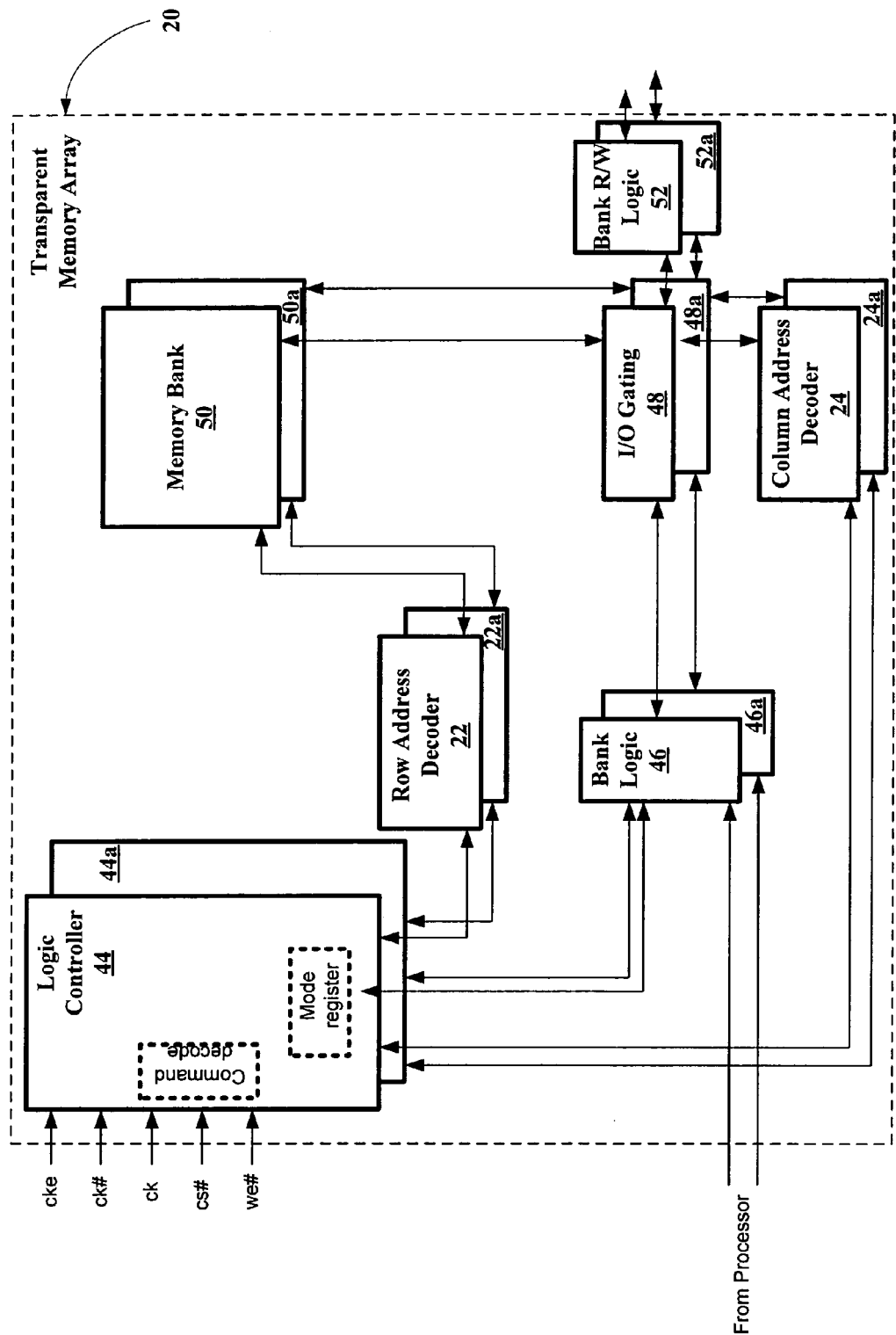
FIG. 5 illustrates a transparent memory array according to another embodiment of the present invention.

FIG. 5 illustrates a transparent memory array 20 according to another embodiment of the present invention. Embedded memory array 20 contains a multitude of the memory banks (e.g., 50, 50a), row address decoders (e.g., 22, 22a) and column address decoders (e.g., 24, 24a) as were discussed in conjunction with FIG. 4. Each row address decoder (e.g., 22, 22a) and column address decoder (e.g., 24, 24a) has an address input bus and an address output bus. In the current embodiment, memory array 20 is further comprised of a multitude of logic controllers (e.g., 44, 44a) bank logic (e.g., 46, 46a), I/O gating DM mask logic (e.g., 48, 48a), and bank R/W logic (e.g., 52, 52a). It should be noted that only two of each component is illustrated for simplicity, however, components may be added or removed while remaining within the scope of the present invention.

Control logic 44 and control logic 44a simultaneously receive external clock signals (e.g., cke, ck#, and ck) and other signals (e.g., we# and cs) from a processor (not shown) or other external circuits. Control logic 44 and control logic 44a contain a mode register to store information related to the memory array 20 and information related to the signals received from the processor, among others. Control logic 44 and control logic 44a also contain a command decode module that is operable to accept and implement command signals from the processor or other circuits.

In the current embodiment, control logic 44 accesses memory bank 50 through row address decoder 22, column address decoder 24, and bank control logic 46, while control logic 44a may simultaneously access memory bank 50a through row address decoder 22a, column address decoder 24a, and bank control logic 46a. In the current embodiment, multiplexers are not required to simultaneously access the memory banks 50, 50a. Thus, delays caused by the use of multiplexers are eliminated and the throughput of memory array 20 is increased.

In the current embodiment, the row address decoders 22, 22a and the column address decoders 24, 24a communicate with the control logic 44 and control logic 44a, respectively, and may communicate with external circuits such as the processor. The functions of the row address decoders 22, 22a and the column address decoders 24, 24a were previously described in conjunction with FIG. 3.

In the current embodiment, bank control logic block 46, 46a functions as an arbitration unit. Bank control logic block 46, 46a receives an bank address request from the processor. Bank control logic block 46, 46a then compares a request to the memory banks that are available. If a memory bank is available, bank control logic block 46, 46a grants the request; else, bank control logic block 46, 46a denies the request. For example, if memory bank 50 is busy (e.g., being accessed by a previous request) when a new request is sent from the processor, bank control logic block 46 will deny the new request until the previous request is completed. However, a request for memory block 50a is granted by bank control logic block 46a to simultaneously be completed, even though memory block 50 is busy with the previous request.

The DM mask logic 48, 48a and R/W logic 52, 52a function in a manner similar to that of other SDRAM devices. For example, when the DM mask logic 48, 48a has a high value, a corresponding byte will be blocked during a write cycle. Furthermore, the R/W logic 52, 52a is controlled by signal we#. For example, a write cycle is represented by a low value for we#, and a read cycle is represented by a high value for #we.

Figure 6:
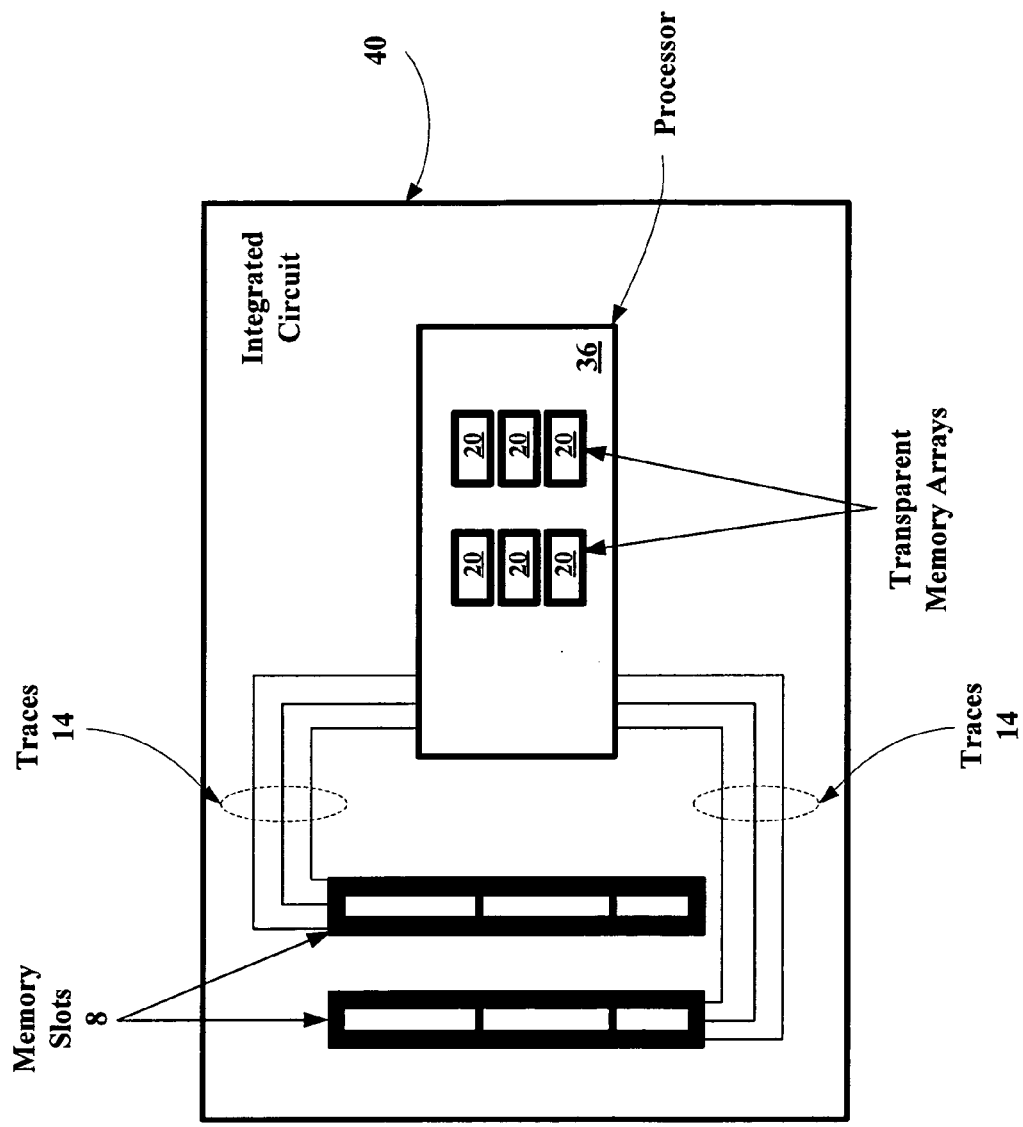
FIG. 6 illustrates the integrated circuit utilizing transparent SDRAM memory arrays according to another embodiment of the present invention.

FIG. 6 illustrates the integrated circuit 40 utilizing transparent SDRAM memory arrays 20 according to another embodiment of the present invention. In this alternative embodiment, the transparent SDRAM memory arrays 20 are placed directly within the processor 36. Such placement further shortens the traces connecting the memory arrays 20 to the processor 36. As discussed in conjunction with FIG. 5, each memory array 20 (and each memory bank with memory array 20) is individually connected to the processor 36.

As illustrated in FIG. 6, memory slots 8 are connected to the processor 36 via slot traces 14. Memory slots 8 may accept additional external memory cards that can be used in conjunction with the memory arrays 20.

Figure 7A:
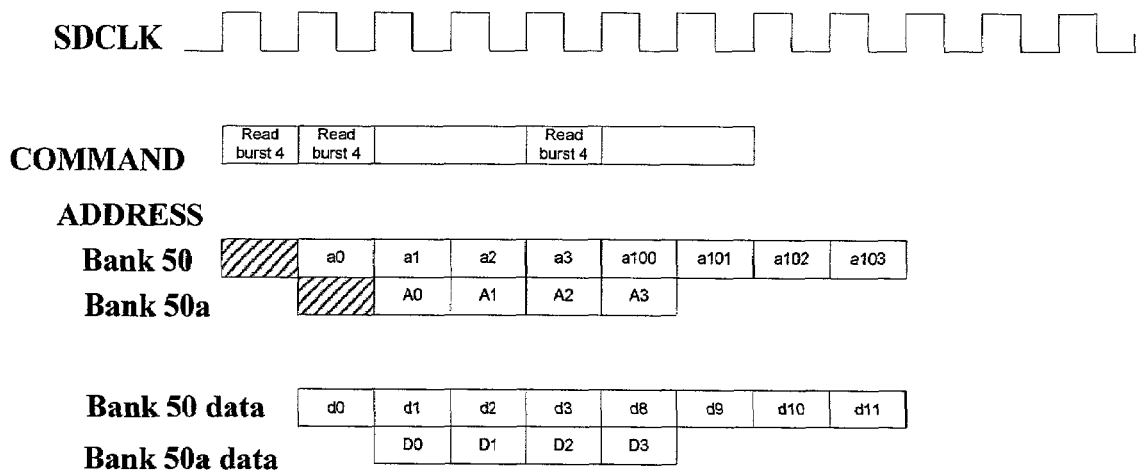
FIG. 7A illustrates a timing diagram of a transparent SDRAM read operation according to an embodiment of the present invention.

FIG. 7A illustrates a timing diagram of the transparent SDRAM during a read operation according to an embodiment of the present invention. For simplicity, reference is made to the transparent SDRAM shown in FIG. 5. A clock signal (e.g., SDCLK) is supplied by the processor to logic controllers 44, 44a. The processor also sends other control and address signals to the controllers 44, 44a. As seen in FIG. 7A, the processor sends a burst 4 read signal command for memory bank 50 on the first clock pulse. A burst 4 signal refers to a signal that is processed over four clock cycles. On the second clock pulse, the bank's address information a0 is processed by the row address decoder 22 and the column address decoder 24, the appropriate cell within bank 50 is selected, and data d0 is provided at the bank 50 output. Because the address and data information wasn't processed until the second clock pulse, the transparent SDRAM 20 is said to have a latency of 1.

Additionally at the second clock pulse, a burst 4 read signal command is sent for memory bank 50a. On the third clock pulse, the second burst of the signal sent to memory bank 50 is processed. Address information a1 is processed and data d1 is provided at the bank 50 output. Simultaneously on the third clock pulse (because of the latency), address information A0 is processed by the row address decoder 22a and the column address decoder 24a and data D0 is provided at the output of bank 50a.

As illustrated in FIG. 7A, memory bank 50 and memory bank 50a are simultaneously accessed, thereby increasing the throughput. Another burst 4 read signal for memory bank 50 is sent on the fifth clock pulse. The arbitration unit assures that this burst 4 read signal is processed after memory bank 50 finishes processing the earlier burst 4 read signal.

It should be noted that according to the present invention, the entire memory is treated as one page without the need for a precharge signal. Thus, there is no RAS signal to CAS signal delay time, nor is there a precharge delay time. Furthermore, it should be noted that read signals other that burst 4 read signals can be used while remaining within the scope of the present invention.

Figure 7B:
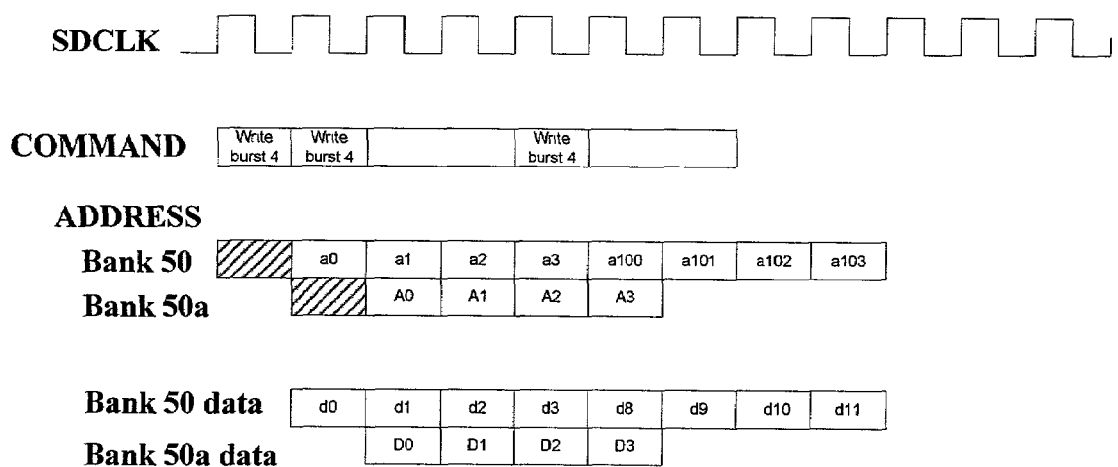
FIG. 7B illustrates a timing diagram of a transparent SDRAM write operation according to an embodiment of the present invention.

FIG. 7B illustrates a timing diagram of the transparent SDRAM during a write operation according to an embodiment of the present invention. For simplicity, reference is again made to the transparent SDRAM shown in FIG. 5. Again, clock signal (e.g., SDCLK) is supplied by the processor to controllers 44, 44a. The processor also sends other control and address signals to the controllers 44, 44a. As seen in FIG. 7B, the processor sends a burst 4 write signal command for memory bank 50 on the first clock pulse. On the second clock pulse, the address information a0 is processed by the row address decoder 22 and the column address decoder 24 and the appropriate cell within bank 50 is selected. The data d0 is written to the cell within bank 50 on the second clock pulse. Because the address a0 and data d0 information wasn't processed until the second clock pulse, the transparent SDRAM 20 is said to have a latency of 1.

Additionally at the second clock pulse, a burst 4 write signal command is sent to memory bank 50a. On the third clock pulse, the second burst of the signal sent to memory bank 50 is processed. Address information a1 is processed and data d1, provided at the bank 50 output, is written to the selected cell. Simultaneously on the third clock pulse (because of the latency), address information A0 is processed by the row address decoder 22a and the column address decoder 24a and data D0 is provided at the output of bank 50a. The data D0 is simultaneously written to the selected memory cell within bank 50a.

As illustrated in FIG. 7B, memory bank 50 and memory bank 50a are simultaneously accessed, thereby increasing the throughput. Another burst 4 write signal for memory bank 50 is sent on the fifth clock pulse. The arbitration unit assures that this burst 4 write signal is processed after memory bank 50 finishes processing the earlier burst 4 write signal.

It should be noted that according to the present invention, the entire memory is treated as one page without the need for a precharge signal. Thus, there is no RAS signal to CAS signal delay time, nor is there a precharge delay time. Furthermore, it should be noted that write signals other that burst 4 write signals can be used while remaining within the scope of the present invention.

It should be clear that the present invention is not limited to the specific embodiments disclosed herein. Various modifications may be made by one skilled in the art while remaining within the scope of the present invention.

What is claimed is:

1. A combination comprising:
   an integrated circuit having a processor;
   an embedded memory array, said memory array having a plurality of controllers and a plurality of memory banks, each of said memory banks being independently connected to one of said plurality of controllers, each of said controllers being independently connected to said processor:
   a plurality of row address decoders, each of said row address decoders being connected to one of said memory banks and to one of said controllers; and
   a plurality of column address decoders, each of said column address decoders being connected to one of said memory banks and to one of said controllers such that said processor may simultaneously communicate with different memory addresses in two or more of said memory banks.

2. The combination of claim 1 wherein the memory array further comprises:
a data bus having a plurality of data lines, at least one of said plurality of data lines being connected to each of said memory banks.

3. The combination of claim 2 wherein said data bus is operable to simultaneously receive data from each of said memory banks.

4. The combination of claim 2 wherein said data bus is operable to simultaneously provide data to each of said memory banks.

5. The combination of claim 1 wherein said processor is operable to simultaneously send different address information to more than one of said plurality of row address decoders and said plurality of column address decoders.

6. The combination of claim 1 wherein said embedded memory array is comprised of synchronous dynamic random access memory.

7. A combination comprising:
an integrated circuit having a processor; and
an embedded memory array, said memory array having a plurality of memory banks, each of said memory banks being connected to said processor independently of the connection of said other memory banks to said processor such that said processor may simultaneously communicate with different memory addresses in two or more of said memory banks.

8. The combination of claim 7 wherein the memory array further comprises:
a plurality of controllers, each of said plurality of controllers being independently connected to said processor;
a plurality of row address decoders, each of said row address decoders being connected to one of said memory banks and to one of said controllers; and
a plurality of column address decoders, each of said column address decoders being connected to one of said memory banks and to one of said controllers.

9. The combination of claim 7 wherein the memory array further comprises:
a data bus having a plurality of data lines, at least one of said plurality of data lines being connected to each of said memory banks.

10. The combination of claim 9 wherein said data bus is operable to simultaneously receive data from each of said memory banks.

11. The combination of claim 9 wherein said data bus is operable to simultaneously provide data to each of said memory banks.

12. The combination of claim 8 wherein said processor is operable to simultaneously send address information to more than one of said plurality of controllers.

13. The combination of claim 7 wherein said embedded memory array is comprised of synchronous dynamic random access memory.

14. A combination, comprising:
a processor; and
a plurality of transparent SDRAM, each of said memory arrays having a plurality of memory banks, each of said memory banks being connected to said processor independently of the connection of said other memory banks to said processor such that said processor may simultaneously communicate with different memory addresses in two or more of said memory banks.

15. The combination of claim 14 wherein each of said plurality of transparent SDRAM memory arrays further comprises:
a plurality of controllers, each of said plurality of controllers being independently connected to said processor and to one of said plurality of memory banks;
a plurality of row address decoders, each of said row address decoders being connected to one of said plurality of memory banks and to one of said controllers; and
a plurality of column address decoders, each of said column address decoders being connected to one of said plurality of memory banks and to one of said controllers.

16. The combination of claim 15 wherein the transparent SDRAM memory array further comprises:
a data bus having a plurality of data lines, at least one of said plurality of data lines being connected to each of said plurality of memory banks.

17. The combination of claim 16 wherein said data bus is operable to simultaneously receive data from each of said plurality of memory banks.

18. The combination of claim 16 said data bus is operable to simultaneously provide data to each of said plurality of memory banks.

19. The combination of claim 15 wherein said processor is operable to simultaneously send address information to more than one of said plurality of controllers.

20. A combination, comprising:
a processor; and
a plurality of transparent SDRAMs each having a plurality of memory banks, each of said plurality of memory banks being directly connected to said processor;
a plurality of controllers, each of said plurality of controllers being independently connected to said processor and to one of said plurality of memory banks;
a plurality of row address decoders, each of said row address decoders being connected to one of said plurality of memory banks and to one of said controllers; and
a plurality of column address decoders, each of said column address decoders being connected to one of said plurality of memory banks and to one of said controllers such that said processor may simultaneously communicate with different memory addresses in two or more of said memory banks.

21. The combination of claim 20 wherein the memory array further comprises:
a data bus having a plurality of data lines, at least one of said plurality of data lines being connected to each of said plurality of memory banks.

22. The combination of claim 21 wherein said data bus is operable to simultaneously receive data from each of said plurality of memory banks.

23. The combination of claim 21 wherein said data bus is operable to simultaneously provide data to each of said plurality of memory banks.

24. The combination of claim 20 wherein said processor is operable to simultaneously send address information to more than one of said plurality of controllers.

25. A combination, comprising:
a processor; and
a transparent SDRAM having a plurality of memory banks connected to said processor such that said processor may simultaneously access different memory addresses in two or more of said plurality of memory banks.

26. The combination of claim 25 wherein each of said plurality of transparent SDRAM memory arrays further comprises:
- a plurality of controllers, each of said plurality of controllers being independently connected to said processor and to one of said plurality of memory banks;
- a plurality of row address decoders, each of said row address decoders being connected to one of said plurality of memory banks and to one of said controllers; and
- a plurality of column address decoders, each of said column address decoders being connected to one of said plurality of memory banks and to one of said controllers.

27. The combination of claim 26 wherein the transparent SDRAM memory array further comprises:
- a data bus having a plurality of data lines, at least one of said plurality of data lines being connected to each of said plurality of memory banks.

28. The combination of claim 27 wherein said data bus is operable to simultaneously receive data from each of said plurality of memory banks.

29. The combination of claim 27 wherein said data bus is operable to simultaneously provide data to each of said plurality of memory banks.

30. The combination of claim 26 wherein said processor is operable to simultaneously send address information to more than one of said plurality of controllers.

31. A transparent memory array comprising:
- a plurality of memory banks each comprised of a plurality of memory cells; and
- a plurality of circuits for writing information into and reading information out of said memory cells, said plurality of circuits including a plurality of controllers, one of each said plurality of controllers connected to one of each said plurality of memory banks, and wherein said plurality of controllers is operable to simultaneously communicate with a processor such that said processor may simultaneously communicate with different memory addresses in two or more of said memory banks.

32. The transparent memory array of claim 31 wherein said plurality of circuits further comprises:
- a plurality of row address decoders, each of said plurality of row address decoders having a row address input bus and a row address output bus, at least one of said plurality of row address decoders having said row address input bus connected to one of said plurality of controllers and having said row address output bus connected to one of said plurality of memory banks; and
- a plurality of column address decoders, each of said plurality of column address decoders having a column address input bus and a column address output bus, at least one of said plurality of column address decoders having said column address input bus connected to said at least one of said plurality of controllers and having said column address output bus connected to said at least one of said plurality of memory banks.

33. The transparent memory array of claim 31 wherein said plurality of controllers are operable to simultaneously exchange at least one of address information and data with a processor.

34. The transparent memory array of claim 31 wherein said plurality of controllers are operable to simultaneously exchange at least one of address information and data with said plurality of memory banks.

35. The transparent memory array of claim 31 further comprising a data bus, said data bus having a plurality of data lines connected with each of said plurality of memory banks, said data bus operable to simultaneously carry data signals from each of said plurality of memory banks.

36. The transparent memory array of claim 31 wherein at least two of said memory arrays have a different data signal burst mode.

37. A method for decreasing the access latency of an integrated circuit having a processor and a plurality of embedded memory arrays, said plurality of memory arrays having a plurality of memory banks, said method comprising:
- connecting each of said plurality of memory banks to said processor; and
- simultaneously accessing different addresses within at least two of said plurality of embedded memory banks with said processor.

38. The method of claim 37 wherein said connecting step further comprises:
- connecting each of said plurality of memory banks to one of a plurality of row address decoders, said one of said plurality of row address decoders being connected to said processor; and
- connecting each of said plurality of memory banks to one of a plurality of column address decoders, said one of said plurality of column address decoders being connected to said processor.

39. The method of claim 37 wherein said simultaneously accessing step further comprises at least one of:
- simultaneously exchanging row address information between said processor and more than one of said plurality of row address decoders;
- simultaneously exchanging column address information between said processor and more than one of said plurality of column address decoders; and
- simultaneously exchanging data between said processor and more than one of said plurality of memory banks.

40. A method for increasing the throughput of an integrated circuit having a processor and an transparent SDRAM array, said transparent SDRAM array having a controller, a data bus, and a plurality of memory banks, each of said plurality of memory banks being independently connected to said controller, said method comprising at least one of:
- simultaneously reading data from more than one memory address within two or more of said plurality of memory banks; and
- simultaneously writing data to more than one memory address within two or more of said plurality of memory banks.

41. The method of claim 40 wherein said simultaneously reading step further comprises:
- simultaneously exchanging read address information between said processor and more than one of said plurality of memory banks; and
- providing a data signal from said more than one of said plurality of memory banks to said data bus.

42. The method of claim 40 wherein said simultaneously writing step further comprises:
- simultaneously exchanging write address information between said processor and said more than one of said plurality of memory banks;
- providing a data signal from said data bus to said more than one of said plurality of memory banks.

43. The method of claim 41 wherein each of said memory banks has a row address decoder and a column address decoder associated therewith, said exchanging read address information step further comprises:

transmitting a first row address information from said processor to a first row address decoder;

transmitting a first column address information from said processor to a first column address decoder; and simultaneously transmitting at least one of another row address information and column address information from said processor to at least one of another row address decoder and another column address decoder.

44. The method of claim 42 wherein said providing a data signal from said more than one of said plurality of memory banks to said data bus further comprises:

simultaneously decoding said read address information exchanged between said processor and said more than one of said memory banks;

selecting a memory cell within each of said more than one of said memory banks based on said read address information; and simultaneously reading said data signal from said selected memory cells within said more than one of said plurality of memory banks.

45. The method of claim 42 wherein each of said memory banks has a row address decoder and a column address decoder associated therewith, said exchanging write address information step further comprises:

transmitting a first row address information from said processor to a first row address decoder;

transmitting a first column address information from said processor to a first column address decoder; and simultaneously transmitting at least one of another row address information and column address information from said processor to at least one of another row address decoder and another column address decoder.

46. The method of claim 42 wherein said providing a data signal from said data bus to said more than one of said plurality of memory banks further comprises:

simultaneously decoding said write address information exchanged between said processor and said more than one of said memory banks;

selecting a memory cell within said each of said more than one of said memory banks based on said write address information; and simultaneously writing said data signal from said data bus within each of said selected memory cells.

* * * * *

UNITED STATES PATENT AND TRADEMARK OFFICE
CERTIFICATE OF CORRECTION

PATENT NO.        : 7,139,893 B2                                                      Page 1 of 1
APPLICATION NO. : 10/016799
DATED             : November 21, 2006
INVENTOR(S)       : Chia-Lun Hang It is certified that error appears in the above-identified patent and that said Letters Patent is hereby corrected as shown below:

Column 3, Line 50, delete "on" and substitute therefore --one--.

Column 4, Line 63, after "the" delete "a".

Column 10, Line 3, delete "that" and substitute therefore --than--.

Column 10, Line 45, delete "that" and substitute therefore --than--.

Signed and Sealed this

Thirtieth Day of October, 2007

JON W. DUDAS
*Director of the United States Patent and Trademark Office*